United States Patent
Gu et al.

(10) Patent No.: US 10,572,038 B2
(45) Date of Patent: Feb. 25, 2020

(54) SHIFT REGISTER UNIT, DRIVE METHOD THEREOF, GATE DRIVE DEVICE, AND DISPLAY DEVICE

(71) Applicants: BOE Technology Group Co., Ltd., Beijing (CN); Hefei BOE Optoelectronics Technology Co., Ltd., Hefei (CN)

(72) Inventors: Honggang Gu, Beijing (CN); Xiaohe Li, Beijing (CN); Xianjie Shao, Beijing (CN); Jie Song, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 177 days.

(21) Appl. No.: 15/540,207

(22) PCT Filed: Jan. 14, 2016

(86) PCT No.: PCT/CN2016/070869
§ 371 (c)(1),
(2) Date: Jun. 27, 2017

(87) PCT Pub. No.: WO2017/028488
PCT Pub. Date: Feb. 23, 2017

(65) Prior Publication Data
US 2017/0364170 A1    Dec. 21, 2017

(30) Foreign Application Priority Data
Aug. 20, 2015   (CN) .......................... 2015 1 0515960

(51) Int. Cl.
*G11C 19/00*        (2006.01)
*G06F 3/041*        (2006.01)
(Continued)

(52) U.S. Cl.
CPC ............ *G06F 3/041* (2013.01); *G02F 1/1362* (2013.01); *G06F 3/0416* (2013.01); *G09G 3/20* (2013.01);
(Continued)

(58) Field of Classification Search
None
See application file for complete search history.

(56) References Cited

U.S. PATENT DOCUMENTS 9,459,730 B2 * 10/2016 Long .................... G09G 3/3677
9,766,741 B2 *  9/2017 Zhao .................... G09G 3/3677
(Continued)

FOREIGN PATENT DOCUMENTS

CN       103996370 A     8/2014
CN       104021769 A     9/2014
(Continued)

OTHER PUBLICATIONS

Sep. 13, 2017—(CN) Second Office Action Appn 201510515960.6 with English Tran.
(Continued)

*Primary Examiner* — Tuan T Lam
(74) *Attorney, Agent, or Firm* — Banner & Witcoff, Ltd.

(57) ABSTRACT

A shift register unit, drive method thereof, gate drive device and display device. The shift register unit includes: an input subcircuit; a reset subcircuit; an output subcircuit configured to provide a clock signal at a clock signal end to a current stage shift register unit output end in response to a voltage signal at the pull-up node and a control signal having a first voltage level, and to disable an output at the current stage output end in response to the control signal having a second voltage level; a pull down control subcircuit configured to provide a second voltage signal having a low voltage level to a pull-down node in response to the voltage signal at the
(Continued)

pull-up node, and to provide the voltage signal having a high voltage level to the pull-down node in response to the voltage signal having a high voltage level; and a pull down subcircuit.

12 Claims, 9 Drawing Sheets

(51) Int. Cl.
| | |
|---|---|
| *G09G 3/36* | (2006.01) |
| *G11C 19/28* | (2006.01) |
| *G09G 3/20* | (2006.01) |
| *G11C 7/02* | (2006.01) |
| *G02F 1/1362* | (2006.01) |
| *G11C 19/18* | (2006.01) |
| *H03K 19/003* | (2006.01) |
| *G06F 3/044* | (2006.01) |

(52) U.S. Cl.
CPC ................. *G09G 3/36* (2013.01); *G11C 7/02* (2013.01); *G11C 19/184* (2013.01); *G11C 19/28* (2013.01); *G11C 19/287* (2013.01); *H03K 19/00384* (2013.01); *G02F 2001/136245* (2013.01); *G06F 3/044* (2013.01); *G06F 3/0412* (2013.01); *G09G 3/3677* (2013.01); *G09G 2310/0267* (2013.01); *G09G 2310/0286* (2013.01)

(56) References Cited

U.S. PATENT DOCUMENTS

| | | | |
|---|---|---|---|
| 2017/0193943 A1* | 7/2017 | Cao | H01L 27/124 |
| 2017/0221441 A1* | 8/2017 | Gu | G06F 3/0412 |
| 2017/0235421 A1* | 8/2017 | Lin | G02F 1/134309 |
| | | | 345/173 |
| 2018/0046311 A1* | 2/2018 | Gu | G11C 19/28 |
| 2018/0107329 A1* | 4/2018 | Gu | G09G 3/20 |
| 2018/0108291 A1* | 4/2018 | Hao | G09G 3/2092 |
| 2018/0188578 A1* | 7/2018 | Wang | G02F 1/13306 |
| 2018/0204521 A1* | 7/2018 | Gu | G09G 3/36 |

FOREIGN PATENT DOCUMENTS

| | | |
|---|---|---|
| CN | 104217763 A | 12/2014 |
| CN | 104715734 A | 6/2015 |
| CN | 105047168 A | 11/2015 |
| CN | 105096879 A | 11/2015 |
| JP | 2006024350 A | 1/2006 |
| KR | 20140086192 A | 7/2014 |

OTHER PUBLICATIONS

May 19, 2016—(CN) International Search Report and Written Opinion Appn PCT/CN2016/070869 with English Tran.

Mar. 3, 2017—(CN) First Office Action Appn 201510515960.6 with English Tran.

* cited by examiner

900

S901 — In the first phase, after receiving a signal of the signal input end, the input sub-circuit pulls the potential of the pull-up node up to a high level of the high-level voltage signal end; after receiving the high-level voltage signal outputted from the pull-up node, the pull-down controlling sub-circuit pulls the potential of the pull-down node down to a low level The control signal is the first level or the second level S9022 — the second level — In the second mode of the second phase, the output sub-circuit has no output so that the reset sub-circuit has no reset signal input, and at this time the touch signal can be scanned the first level S9021 — In the first mode of the second phase, the output sub-circuit provides a clock signal outputted from the clock signal end for the output end of the shift register unit after receiving the high-level voltage signal outputted from the pull-up node; the pull-down controlling sub-circuit still holds the low level of the pull-down node S903 — In the third phase, after receiving the reset signal of the reset signal end, the reset sub-circuit pulls the pull-up node down to the low level; after receiving the high-level voltage signal outputted from the high-level voltage signal end, the pull-down controlling sub-circuit pulls the pull-down node up to the high level; after receiving the high level outputted from the pull-down node, the pull-down sub-circuit pulls the output end and the pull-up node of the shift register down to the first low-level voltage S904 — in the fourth phase, when the input sub-circuit has no input signal, the pull-down controlling sub-circuit causes the pull-down node to keep the high potential; after receiving the high level outputted from the pull-down node, the pull-down sub-circuit pulls the output end and pull-up node of the shift register down to the first low-level voltage

Fig. 9

SHIFT REGISTER UNIT, DRIVE METHOD THEREOF, GATE DRIVE DEVICE, AND DISPLAY DEVICE

The application is a U.S. National Phase Entry of International Application No. PCT/CN2016/070869 filed on Jan. 14, 2016, designating the United States of America and claiming priority to Chinese Patent Application No. 201510515960.6 filed on Aug. 20, 2015. The present application claims priority to and the benefit of the above-identified applications and the above-identified applications are incorporated by reference herein in their entirety.

TECHNICAL FIELD

The present disclosure relates to the display technical field, and in particular to a shift register unit compatible with touch in cell, a drive method thereof, a gate drive device and a display device.

BACKGROUND

With the widespread use of Liquid Crystal Display (LCD) in life, high-resolution and narrow border have become the current trend of liquid crystal display. The gate driving circuit applied to the panel has become the most important way to achieve the display with a high-resolution and narrow border. The design applying the gate driving circuit GOA (Gate Driver on Array or Gate On Array) may cut the cost of the LCD panel down, and at the same time, reduce a process so as to increase production.

As the Touch Panel has increasingly come into people's lives, the previous input devices are gradually eliminated from the public eye. At present, various types of input devices such as mouse, button, touch panel, control stick, touch screen, and the like, can be used to perform operations of the computer system. The touch screen is becoming increasingly popular due to its usability, versatility of the operation, ever-decreasing prices, and steady increase in yield. The touch screen can be divided into plug-in and embedded touch. Plug-in touch can position the panel with touch function in front of the display so that the touch surface covers the visible area of the display area to realize the touch. Embedded touch integrates the touch function in the panel with or without a cover glass outside itself so that the user can touch the screen through fingers to achieve the operation. Embedded touch is divided into in cell (embedding the touch panel function in LCD pixels) and on cell (embedding the touch panel function between the color filter substrate and polarizing plate). On cell produces the sensor on the outside of LCD screen, and then attaches the polarizing plate to protect the glass and so on. Hybrid In Cell or Full In Cell generally produces the sensor on the side of the TFT glass, or on the side of the TFT glass and CF (color filter), and then forms the panel to realize the touch function.

SUMMARY OF THE INVENTION

Additional aspects and advantages of the present invention will be set forth in part in the description, which follows and, in part, will be obvious from the description, or may be learned by practice of the invention.

The present disclosure provides a new design method for a circuit of a shift register compatible with touch in cell. The present design of the touch in cell provides a scanning way for data transmission to achieve the touch function, but the traditional panel signal would interfere with the touch signal so that the touch function is affected. Through a simple manner, this design can achieve GOA signal storage by line when the touch signal is transmitted and GOA signal continuous scanning by line when the touch signal transmission is completed to prevent the touch signal and panel signals from interfering with each other. This design can achieve the switch between touch function GOA and traditional GOA, and also realize PD constantly being at high potential in the non-working state, continuous noise reduction and yield improvement.

The present disclosure is mainly used for the field of liquid crystal display. It provides a new circuit design for a shift register compatible with touch in cell. Compared with the traditional GOA design, this disclosure can realize GOA function with the touch in cell and the traditional GOA function by adjusting the GHG signal. In this design, when GHG is the high level, the traditional GOA function can be implemented; at the same time, the pull-down node PD constantly being at high potential in the non-working state, continuous noise reduction and yield improvement can be achieved; when GHG is the low level, a storage state which implements the scanning of the touch in cell can be implemented; when the touch scanning is completed, GHG is in the high level and the implementation of the panel scanning task continues, meanwhile, two-way scanning can be achieved.

The technical problem to be solved by the present disclosure is to: through a simple manner, realize GOA signal storage by line when touch signal is transmitted and GOA signal continuously scanning by line when touch signal transmission is completed to prevent a touch signal and a panel signal from interfering with each other. This is a new design.

The present disclosure provides a shift register unit comprising: an input sub-circuit connecting a signal input end, a high-level voltage signal end and a pull-up node, is configured to provide the high-level voltage signal for the pull-up node in response to an input signal of the signal input end; a reset sub-circuit connecting a reset signal end, a first low-level voltage signal end and a pull-up node, is configured to provide the first low-level voltage signal for the pull-up node in response to the reset signal of the reset signal end; an output sub-circuit connecting a clock signal end, a control signal end, a pull-up node, a pull-down sub-circuit and an output end at the current stage, is configured to provide a clock signal outputted by the clock signal end for an output end of the shift register unit at the current stage in response to a voltage signal of the pull-up node and a control signal of a first level, and to make the output end at the current stage have no output to scan the touch signal in response to the control signal of the second level; a pull-down controlling sub-circuit connecting the high-level voltage signal end, the pull-up node, a second low-level voltage signal end and the pull-down node, is configured to provide the second low-level voltage signal for the pull-down node in response to the voltage signal of the pull-up node, and provide high-level voltage signal to the pull-down node in response to the high-level voltage signal; a pull-down sub-circuit connecting the second low-level voltage signal end, the pull-down node and the output end at the current stage, is configured to provide the second low-level voltage signal to the pull-up node and the output end at the current stage in response to the voltage signal of the pull-down node; wherein the output end at the current stage maintains a stable output of the clock signal when the control signal is the first level, the output end at the current stage has no output in order to scan the touch signal when the control signal is the second level, and the control signal becomes the first level to continue to the gate scanning of the panel by line when the touch scan is completed.

The present disclosure also provides a gate drive device comprising cascaded N shift register units, which include the first shift register unit to the Nth shift register unit; each of the shift register units is the above shift register unit, wherein N is a natural number, the signal input end of each shift register unit from the second shift register unit to the Nth shift register unit is connected to the output end of its adjacent shift register unit at the previous stage, the reset signal end of each shift register unit from the first shift register unit to the N−1th shift register unit is connected to the output end of its adjacent shift register unit at the next stage, the signal input end of the first shift register unit is connected to a start signal end, and the reset signal end of the Nth shift register is connected to the start signal end.

The present disclosure also provides a display device comprising the gate drive device as described above.

The present disclosure also provides a drive method for a shift register unit, which includes an input sub-circuit, a reset sub-circuit, an output sub-circuit, a pull-down controlling sub-circuit, a pull-down sub-circuit; wherein the input sub-circuit connects a signal input end, a high voltage signal end and a pull-up node; the reset sub-circuit connects a reset signal end, a first low-level voltage signal end and the pull-up node; the output sub-circuit connects a clock signal end, a control signal end, the pull-up node and an output end at the current stage; the pull-down controlling sub-circuit connects the high-level voltage signal end, the pull-up node, a second low-level voltage signal end and the pull-down node; the pull-down sub-circuit connects the second low-level voltage signal end, the pull-down node, the pull-up node and the output end at the current stage; the drive method comprises: in the first phase, after receiving a signal of the signal input end, the input sub-circuit pulls the potential of the pull-up node up to the high level of the high-level voltage signal end; after receiving the high-level voltage signal outputted by the pull-up node, the pull-down controlling sub-circuit pulls the potential of the pull-down node down to the low level; in the first mode of the second phase, when the control signal is the first level, the output sub-circuit provides the clock signal outputted by the clock signal end for the output end of the shift register unit after receiving the high-level voltage signal outputted by the pull-up node; the pull-down controlling sub-circuit still keeps the potential of the pull-down node low; in the second mode of the second phase, when the control signal is the second level, the output sub-circuit has no output so that the reset sub-circuit has no input of the reset signal, at this time the touch signal can be scanned; in the third phase, after receiving the reset signal of the reset signal end, the reset sub-circuit pulls the pull-up node down to the low level; after receiving the high-level voltage signal outputted by the high-level voltage signal end, the pull-down controlling sub-circuit pulls the pull-down node up to the high level; after receiving the high level outputted by the pull-down node, the pull-down sub-circuit pulls the output end and the pull-up node of the shift register down to the second low-level voltage; in the fourth phase, when the input sub-circuit has no input signals, the pull-down controlling sub-circuit makes the pull-down node keep the high potential; after receiving the high level outputted by the pull-down node, the pull-down sub-circuit pulls the output end and the pull-up node of the shift register to the second low-level voltage.

The design of the present disclosure provides a simple manner to realize GOA signal storage by line in transmitting the touch signal and GOA signal continuously scanning by line when the touch signal transmission is completed to prevent a touch signal and a panel signal from interfering with each other.

The design of the present disclosure can achieve the switch between touch function GOA and traditional GOA, and at the same time, it can realize the PD constantly being at a high potential, continuous noise reduction and yield improvement in the non-working state.

BRIEF DESCRIPTION OF THE DRAWINGS

The preferred embodiment of present invention will be described in details with reference to the drawings, such that the above and other objectives, features, and advantages of the present invention will become more clear, wherein like reference numerals refer to the like structural elements and wherein:

FIG. 9 schematically illustrates a flow diagram of a drive method 900 for the shift register unit according to an embodiment of the present disclosure.

DETAILED DESCRIPTION OF THE EMBODIMENTS

Figure 1:
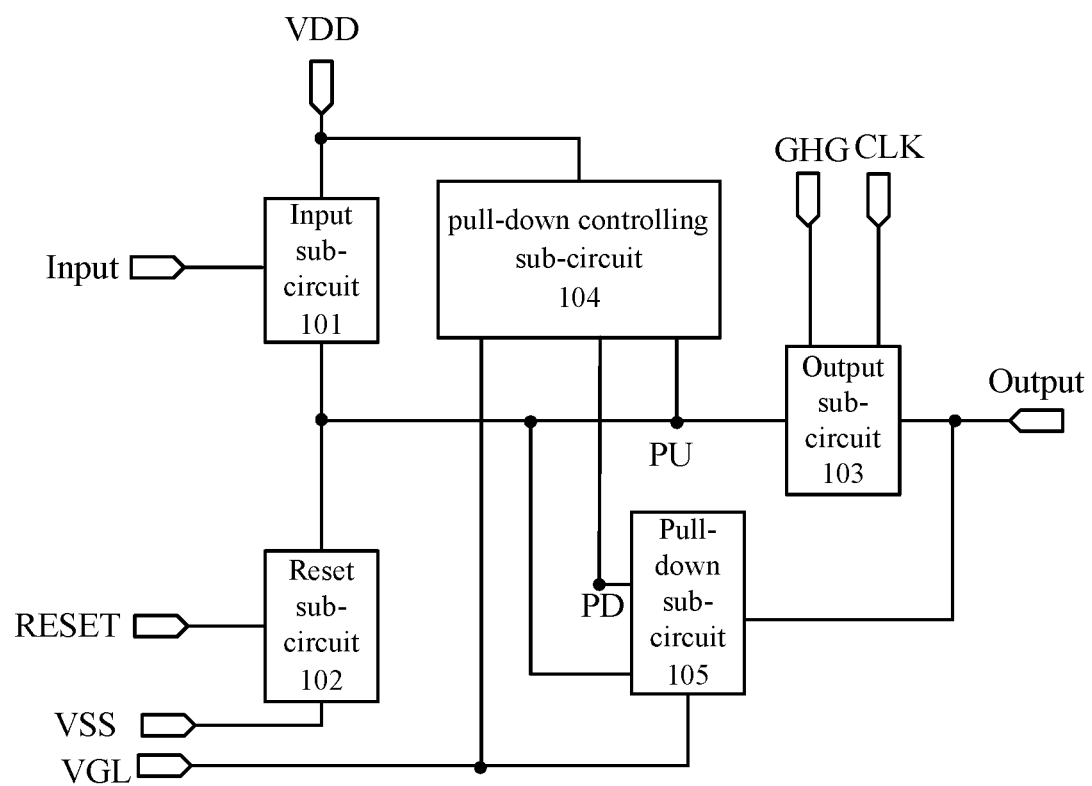
FIG. 1 schematically illustrates a block diagram of a shift register unit according to an embodiment of the present disclosure.

The present disclosure will be described thoroughly below in reference to drawings of the embodiments of the present disclosure. However, the present disclosure can be implemented in many different forms and should not be limited to the embodiments of the present disclosure. On the contrary, these embodiments are provided to make the present disclosure become more thorough and complete, and these fully disclose the scope of the present disclosure for those skilled in the art. In the drawings, assemblies are enlarged for clarity.

It should be understood that: although the terms first, second, third, etc. are used to describe various elements, components, and/or parts, these elements, components and/or parts are not limited by these terms. The function of these terms is only to distinguish these elements, components and/or parts. Therefore, the first element, component or part discussed below may be termed as the second element, component or part without departing from the premise of teachings of the present disclosure.

Unless otherwise defined, all terms (including technical and scientific terms) used herein have the same meaning of those skill in the art commonly understand. It should also be understood that: those terms defined in the ordinary dictionary should be interpreted as a meaning having consistent with their meaning in the context of related art, rather than an idealized or extreme formalized meaning, unless here make a clear definition.

It should be noted that in the embodiment of the present disclosure, voltage VSS supplied by the negative end of power supply is a low level and voltage VDD supplied by the positive end of power supply is a high level. Thin-film transistors applied in all embodiments of the present disclosure are those with a symmetrical source and drain, and all the source and drain are interchangeable in name. In addition, the thin-film transistors may be divided into N-type transistor or P-type transistor in accordance with their characteristics. In the present embodiment, when the N-type thin-film transistor is applied, the first pole thereof may be a source and the second pole thereof is a drain. The thin-film transistor applied in the present embodiment may be N-type transistor or P-type transistor. In the following embodiments of the present disclosure, the thin-film transistors being all N-type transistors will be taken as an example to make an illustration, that is, when the gate signal is the high level, the thin-film transistor is turned on. It is conceivable that it is necessary to adjust the timing of the driving signal accordingly when P-type transistor is applied.

In general, the shift register is composed of a plurality of cascaded shift register units, and each of the present shift register unit can be called as the shift register unit at the current stage; each shift register includes N lines of shift register unit, and the shift register unit in each line includes a shift register unit.

For a further understanding of the present application, a further explanation for the present application is now provided with reference to the accompanying drawings.

FIG. 1 schematically illustrates a block diagram of a shift register unit according to an embodiment of the present disclosure. The shift register shown in FIG. 1 includes an input sub-circuit 101, a reset sub-circuit 102, an output sub-circuit 103, a pull-down controlling sub-circuit 104, and a pull-down sub-circuit 105.

The input sub-circuit 101 connecting a signal input end Input, a high-level voltage signal end VDD and a pull-up node PU, is configured to provide the high-level voltage signal VDD for the pull-up node PU in response to an input signal Input of the signal input end.

The reset sub-circuit 102 connecting a reset signal end RESET, a first low-level voltage signal end VSS and the pull-up node PU, is configured to provide the first low-level voltage signal VSS for the pull-up node PU in response to the reset signal RESET outputted by the reset signal end.

The output sub-circuit 103 connecting a clock signal end CLK, a control signal end GHG, the pull-up node PU and the output end Output at the current stage, is configured to provide the clock signal CLK outputted by the clock signal end for the output end Output of the shift register unit in response to a voltage signal outputted by the pull-up node PU and the control signal GHG of the first level, and to respond to the control signal GHG of the second level so that the output end Output of the shift register unit has no output to scan the touch signal.

The pull-down controlling sub-circuit 104 connecting the high-level voltage signal end VDD, the pull-up node PU, a second low-level voltage signal end VGL and the pull-down node PD, is configured to provide the second low-level voltage signal VGL for the pull-down node PD in response to the voltage signal of the pull-up node PU, and to provide the high-level voltage signal VDD for the pull-down node PD in response to the high-level voltage signal VDD.

The pull-down sub-circuit 105 connecting with the second low-level voltage signal end VGL, the pull-down node PD, the pull-up node PU, and the output end Output at the current stage, is configured to provide the second low-level voltage signal VGL for the pull-up node PU and the output end Output in response to the voltage signal of the pull-down node PD.

The output end at the current stage is the output end of the shift register unit at the current stage.

Due to the shift register unit provided by the present embodiment, an output sub-circuit 203 maintains a stable output of the clock signal CLK when the control signal GHG is the first level (for example, the high level in the present embodiment). When the control signal GHG is the second level (for example, the low level in the present embodiment), the output sub-circuit 203 has no output so that there is no output at the next stage, and at this time, it can scan the touch signal to prevent signals from being simultaneously scanned; when the touch scan is completed, the control signal GHG becomes the first level and continues to implement the gate scan of the panel by line. Those skilled in the art should understand that the first level and the second level may be changed by adjusting the circuit.

The First Embodiment

Figure 2:
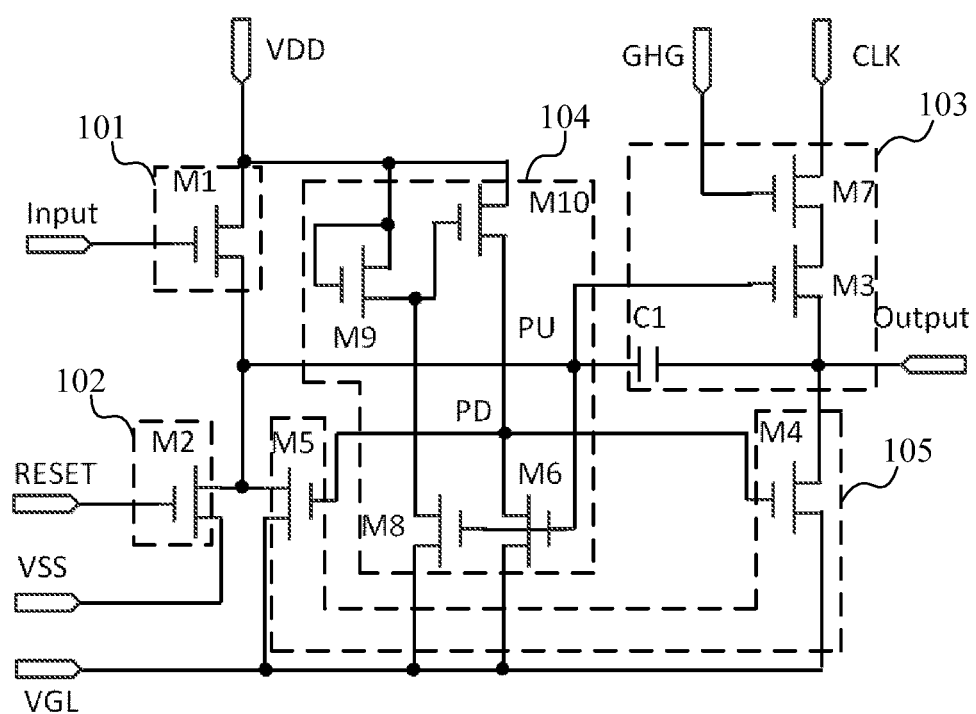
FIG. 2 schematically illustrates an equivalent circuit diagram particularly implementing the shift register unit according to the first embodiment of the present disclosure.

FIG. 2 schematically illustrates an equivalent circuit diagram particularly implementing the shift register unit according to the first embodiment of the present disclosure.

FIG. 2 is an equivalent circuit diagram of a specific implementation of the shift register unit in FIG. 1. FIG. 2 illustrates a specific implementation of the respective sub-circuits of the shift register unit.

Specifically, as shown in FIG. 2, the input sub-circuit 101 includes: a first transistor M1; wherein the gate of the first transistor M1 is connected with the signal input end Input, the first pole (source) thereof is connected with the high-level voltage signal end VDD, the second pole (drain) thereof is connected with the pull-up node PU. Input of the signal input end can be an output of the shift register unit at the previous stage. The high-level signal of the signal input end Input makes the first transistor M1 turn on, and the high-level voltage signal VDD is transmitted to the pull-up node PU to increase the potential of the pull-up node PU. The specific implementing structure, control manner, etc., of the input sub-circuit 101 do not constitute a limitation on the present embodiment.

The reset sub-circuit 102 includes: a second transistor M2; wherein the gate of the second transistor M2 is connected with a reset signal end RESET, the first pole thereof is connected with the first low-level voltage signal end VSS, the second pole thereof is connected with the pull-up node PU. A signal Output of an output end of the shift register at the next stage can be provided for the reset signal end RESET, that is, the reset signal RESET is the output signal of the output end of the shift register at the next stage.

Typically, when the reset signal RESET is a high level, the second transistor M2 is turned on so that the pull-up node PU is connected with the first low-level voltage signal end VSS; since the VSS is a low level, turning on the transistor M2 reduces the level of the pull-up node PU. That is, the reset sub-circuit 102 performs a reset operation on the shift register unit in accordance with the reset signal RESET. The above reset sub-circuit 102 is merely an example, and may have other structures.

The output sub-circuit 103 includes: a third transistor M3, wherein the gate of the third transistor M3 is connected with the pull-up node PU, the first pole thereof is connected with the second pole of a seventh transistor M7, and the second pole thereof is connected with the output end Output at the current stage; a capacitor C1 that is connected between the pull-up node PU and the output end Output at the current stage; and the seventh transistor M7, wherein the gate of the seventh transistor M7 is connected with the control signal end GHG, the first pole thereof is connected the clock signal CLK, and the second pole thereof is connected with the first pole of the third transistor M3.

In the output sub-circuit 103, during the progress of the input sub-circuit 101 raising the potential of the pull-up node PU, the capacitor C1 is charged and stores electrical energy so that the level of the pull-up node PU is pulled up. When the control signal GHG is the first level, the seventh transistor M7 is turned on, the pull-up node PU remains a high level, and the third transistor M3 is turned on, and the signal of the clock signal input end CLK is transmitted to the output end at the current stage to output the output signal at the current stage. When the control signal GHG is the second level, the seventh transistor M7 is turned off, the pull-up node PU remains a high level, the third transistor M3 is turned on, since the seventh transistor M7 is turned off, no output is transmitted to the output end Output at the current stage.

The pull-down controlling sub-circuit 104 includes: a sixth transistor M6, wherein the gate of the sixth transistor M6 is connected with the pull-up node PU, the first pole thereof is connected with the second low-level voltage signal end VGL, the second pole thereof is connected with the pull-down node PD; an eighth transistor M8, wherein the gate of the eighth transistor M8 is connected with the pull-up node PU, the first pole thereof is connected with the second low-level voltage signal end VGL, and the second pole thereof is connected with the gate of a tenth transistor; a ninth transistor M9, wherein the gate and the first pole of the ninth transistor M9 are connected with the high-level voltage signal end VDD, and the second pole thereof is connected with the gate of a tenth transistor M10; the tenth transistor M10, wherein the first pole of the tenth transistor M10 is connected with the high-level voltage signal end VDD, and the second pole thereof is connected with the pull-down node PD.

In the pull-down controlling sub-circuit 104, when the pull-up node PU is a high level, the sixth transistor M6 and the eighth transistor M8 are turned on to pull the pull-down node PD down to a low level, that is, the level pulled down is equal to or close to the low level. When the pull-up node PU is the low level, the sixth transistor M6 and the eighth transistor M8 are turned off, at the same time, the high-level voltage VDD turns the ninth transistor M9 and the tenth transistor M10 on so that the pull-down node is at high level.

The above pull-down controlling sub-circuit 104 is merely an example, and may have other structures.

The pull-down sub-circuit 105 includes: a fourth transistor M4, wherein the gate of the fourth transistor M4 is connected with the pull-down node PD, and the first pole thereof is connected with the second low-level voltage signal end VGL, and the second pole thereof is connected with the output end Output; a fifth transistor M5, wherein the gate of the fifth transistor M5 is connected with the pull-down node PD, the first pole thereof is connected with the second low-level voltage signal end VGL, and the second pole thereof is connected with the pull-up node PU.

In the pull-down sub-circuit 105, the fourth and fifth transistors M4 and M5 are turned on in response to the high-level signal of the pull-down node PD and pull the output end Output and the pull-up node PU down to the second low-level voltage signal VGL.

The above pull-down sub-circuit 105 is merely an example, and may have other structures.

Figure 3:
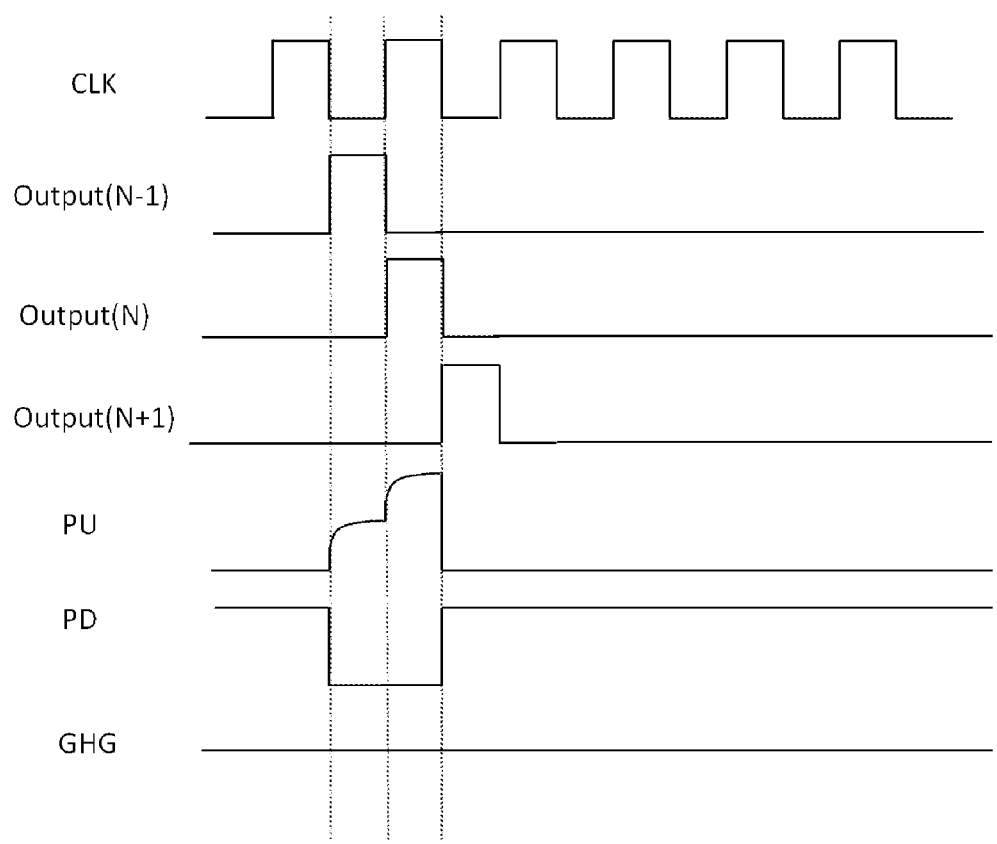
FIG. 3 schematically illustrates a timing diagram of a first mode of the shift register unit according to the first embodiment of the present disclosure.
Figure 4:
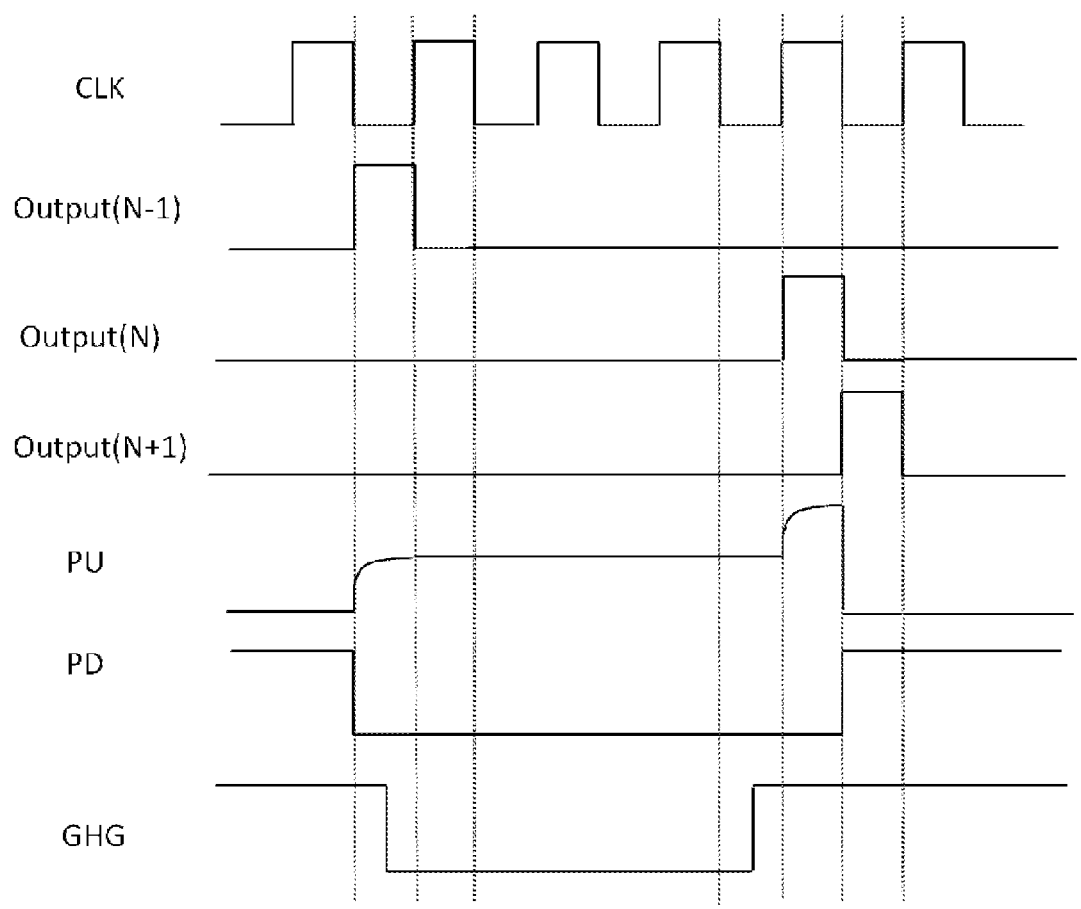
FIG. 4 schematically illustrates a timing diagram of a second mode of the shift register unit according to the first embodiment of the present disclosure.

FIG. 3 schematically illustrates a timing diagram of the first mode of the shift register unit according to the first embodiment of the present disclosure. FIG. 4 schematically illustrates a timing diagram of the second mode of the shift register unit according to the first embodiment of the present disclosure.

As shown in FIG. 3 and FIG. 4, in the first phase: the signal input end Input is a high-level signal, and the input end signal is a signal outputted by the output end Output at the previous stage so that the first transistor M1 is turned on; at this time, the clock signal CLK is a low level, the high-level voltage signal VDD charges the capacitor C1 through the first transistor M1 to pull the voltage of the pull-up node PU up; the pull-up node PU is the high level so that the sixth transistors M6 and the eighth transistor M8 are turned on, pulling the pull-down node PD down to the low level; the pull-down node PD is a low level so that the fourth transistor M4 and the fifth transistor M5 are turned off, thereby ensuring the stable output of the signal. In the second phase: the first mode: when the control signal GHG is the first level, the seventh transistor M7 is turned on; when the signal input end Input is a low level, the first transistor M1 is turned off, the pull-up node PU continues to maintain a high level and the third transistor M3 stays turned on. At this time, the clock signal CLK is at high potential, the pull-up node PU enlarges the voltage of the pull-up node because of the bootstrapping, and finally transmits a driving signal to the output end; at this time, the pull-up node PU is a high level, the sixth and eighth transistors M6 and M8 are still in an on state so that the fourth and fifth transistors M4 and M5 continue to be turned off to ensure the stable output of the signal.

The second mode: when the control signal GHG is the second level, and the seventh transistor M7 stays turned off; when the signal input end Input is a low level, the first transistor M1 is turned off, the pull-up node PU continues to maintain the high level, and the third transistor M3 stays turned on. Since the seventh transistor M7 is in an off state and the clock signal end CLK is the high level, there is no output so that the shift register unit at the next stage has no input, thus there is no input of the reset signal RESET in the second mode; the pull-up node PU maintains the high potential and the sixth and eighth transistors M6 and M8 are still in the on state, thus the fourth and fifth transistors M4 and M5 continue to be turned off, at this time the touch signal can be scanned to prevent signals from the simultaneous scanning; after the touch scan is completed, the control signal GHG becomes the first level, the mode has been changed to the first mode, and the gate scanning of the panel by line continues.

In the third phase: the reset signal RESET is a high level, that is, the output signal of the shift register at the next stage is a high level, so that the second transistor M2 is in the on state, the level of the pull-up node PU is pulled down to achieve turning off the third, sixth and eighth transistors M3, M6 and M8; at the same time, the high-level voltage signal VDD turns the ninth and tenth transistors M9 and M10 on so that the pull-down node PD is at high level, the fourth and fifth transistors M4 and M5 are in the on state to pull the output end Output and the pull-up node PU down to the second low-level voltage VGL.

In the fourth phase: the output end Output is the low level, that is, it is in a no-output state, the first transistor M1 is constantly in the off state, the high-level voltage signal VDD is the high level, the ninth and tenth transistors M9 and M10 are constantly in the on state, so that the pull-down node PD is constantly at the high level in the no-output state; the fourth and fifth transistors M4 and M5 are turned on and continuously reduces noise of the pull-up node PU and output end Output by line; therefore, the above can eliminate coupling noise voltage generated by the clock signal CLK, thereby realizing low voltage output and ensuring the stable output of the signal.

Before the next frame arrives, the gate shift register always repeats the fourth phase and continues to reduce noise of the gate circuit.

The Second Embodiment

Figure 5:
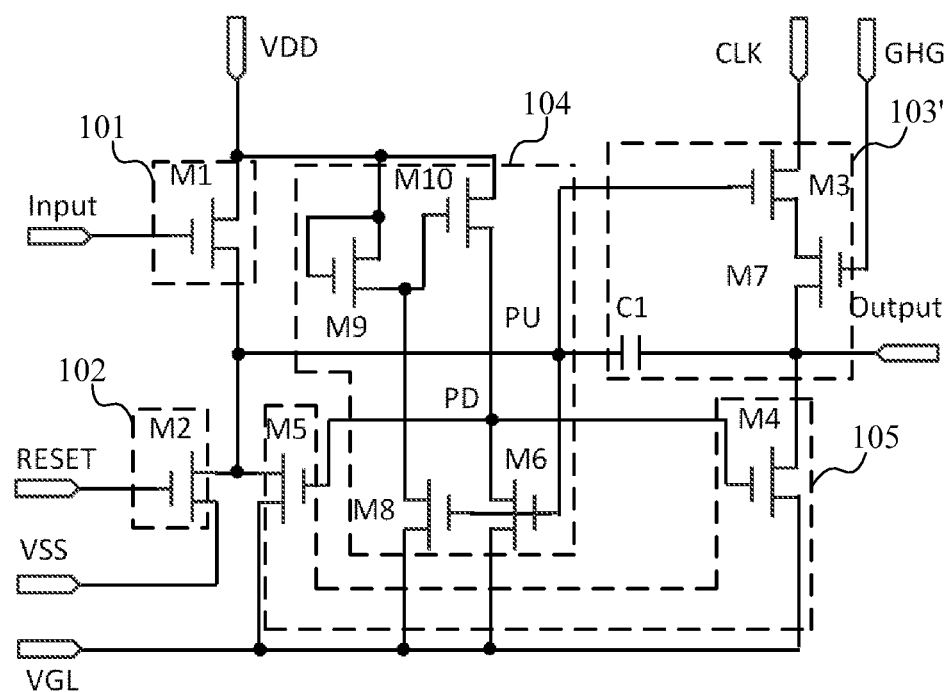
FIG. 5 schematically illustrates an equivalent circuit diagram particularly implementing the shift register unit according to the second embodiment of the present disclosure.

FIG. 5 schematically illustrates an equivalent circuit diagram particularly implementing the shift register unit according to the second embodiment of the present disclosure;

In FIG. 5, elements same as those of the shift register unit in FIG. 2 are denoted by the same reference numerals, and can refer to the above description of FIG. 2.

With respect to the shift register unit in FIG. 2, the output sub-circuit 103' of the shift register unit in FIG. 5 has a different structure from the output sub-circuit 103 in FIG. 2.

As shown in FIG. 5, an output sub-circuit 103' includes: a third transistor M3, wherein the gate of the third transistor M3 is connected with the pull-up node PU, the first pole thereof is connected with the clock signal CLK, and the second pole thereof is connected with the first pole of a seventh transistor M7; a capacitor C1 that is connected between the pull-up node PU and the output end Output at the current stage; and the seventh transistor M7, wherein the gate of the seventh transistor M7 is connected with the control signal end GHG, the first pole thereof is connected with the second pole of the third transistor M3, and the second pole thereof is connected with the output end Output at the current stage.

In the output sub-circuit 103', during the process of the input sub-circuit 101 raising the potential of the pull-up node PU, the capacitor C1 is charged and stored electrical energy, so that the potential of the pull-up node PU is pulled up. When the control signal GHG is the first level, the seventh transistor M7 is turned on, the pull-up node PU continues to remain a high level, and the third transistor M3 is turned on to transmit the signal of the clock signal input end CLK to the output end Output at the current stage to output the output signal at the current stage. When the control signal GHG is the second level, the seventh transistor M7 is turned off, the pull-up node PU continues to remain a high level, the third transistor M3 is turned on, since the seventh transistor M7 is turned off, no output is transmitted to the output end Output at the current stage.

Figure 6:
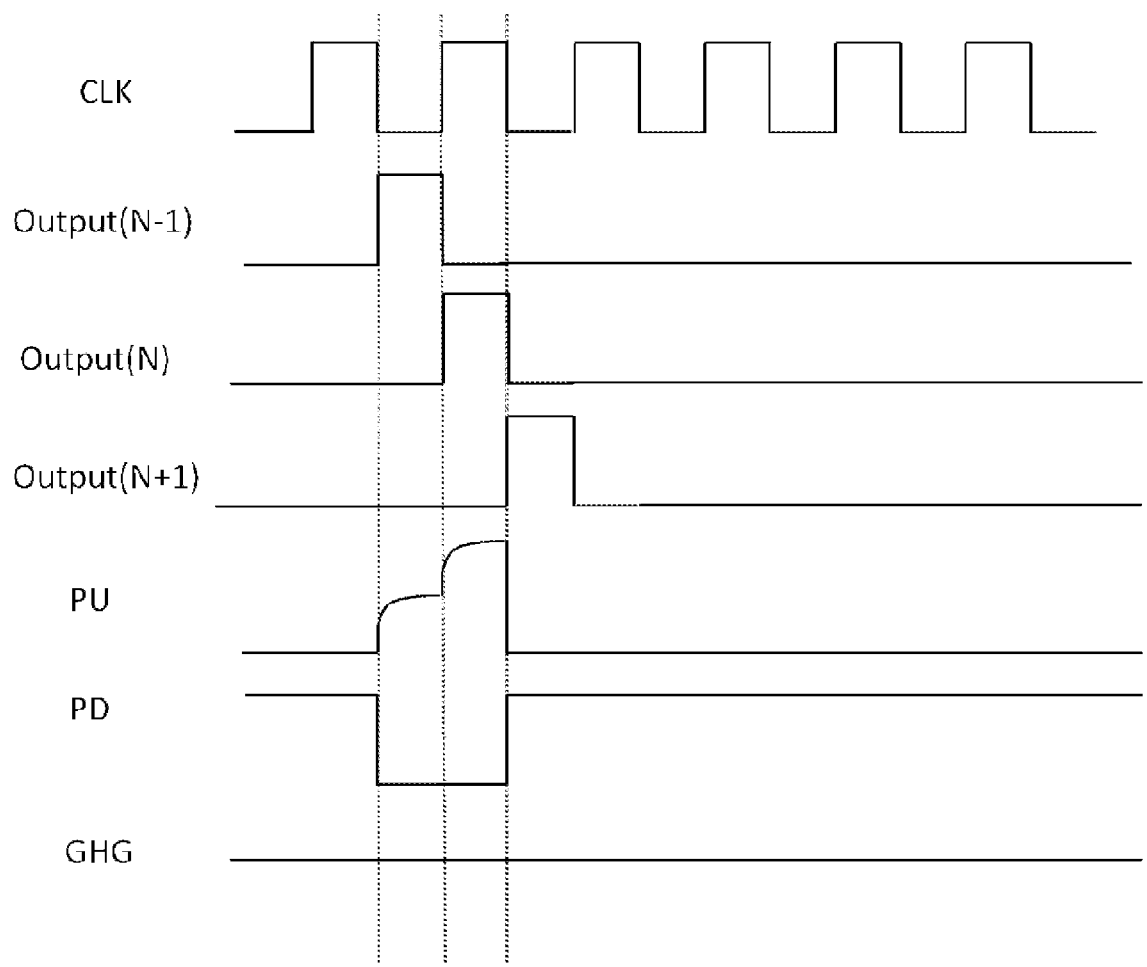
FIG. 6 schematically illustrates a timing diagram of the first mode of the shift register unit according to the second embodiment of the present disclosure.
Figure 7:
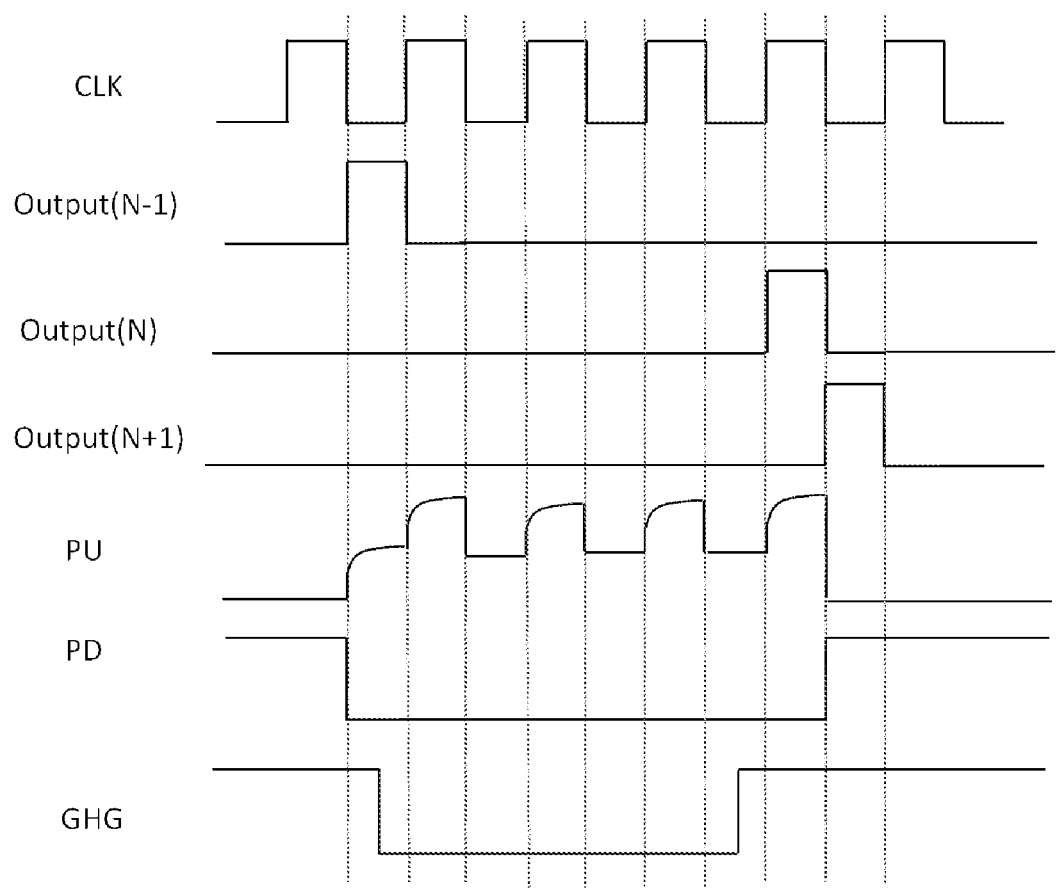
FIG. 7 schematically illustrates a timing diagram of the second mode of the shift register unit according to the second embodiment of the present disclosure.

FIG. 6 schematically illustrates a timing diagram of the first mode of the shift register unit according to the second embodiment of the present disclosure. FIG. 7 schematically illustrates a timing diagram of the second mode of the shift register unit according to the second embodiment of the present disclosure.

The operation principle of the second embodiment is similar to that of the first embodiment except that the following operation: when the pull-up node PU is maintained, there is a process of pulling up the pull-up node PU due to the bootstrap effect of the clock signal CLK.

The present disclosure provides a new circuit design for a shift register compatible with touch in cell. The present design for the touch in cell transmits data through a scanning manner to achieve the touch function; however, the traditional panel signal interferes with the touch signal, causing the touch function to be affected. The design of the present disclosure provides a simple manner to realize GOA signal storage by line when the touch signal is transmitted and GOA signal continuously scanning by line when the touch signal transmission is completed, thereby preventing the touch signal and panel signal from interfering with each other. The design can achieve the switch between touch function GOA and traditional GOA, at the same time, realize the pull-down node PD constantly being at high potential, continuous noise reduction and yield improvement in the non-working state. Those skilled in the art should recognize that the entire structure and operation of all systems suitable for using with the present disclosure are not depicted or described herein for concise and clarity. Instead, only systems are unique or necessary for the understanding of the present disclosure are depicted and described. The remainder of the construction and operation of the disclosed system may conform to various current implementations and practices known in the art.

Certainly, those skilled in the art will recognize that: unless specifically indicated or required by the sequence of operations, certain steps in the processes described above may be omitted, performed concurrently or sequentially, or performed in a different order. Further, no component, element, or process should be considered essential to any specific claimed embodiment, and each of the components, elements, or processes can be combined in still other embodiments.

Figure 8:
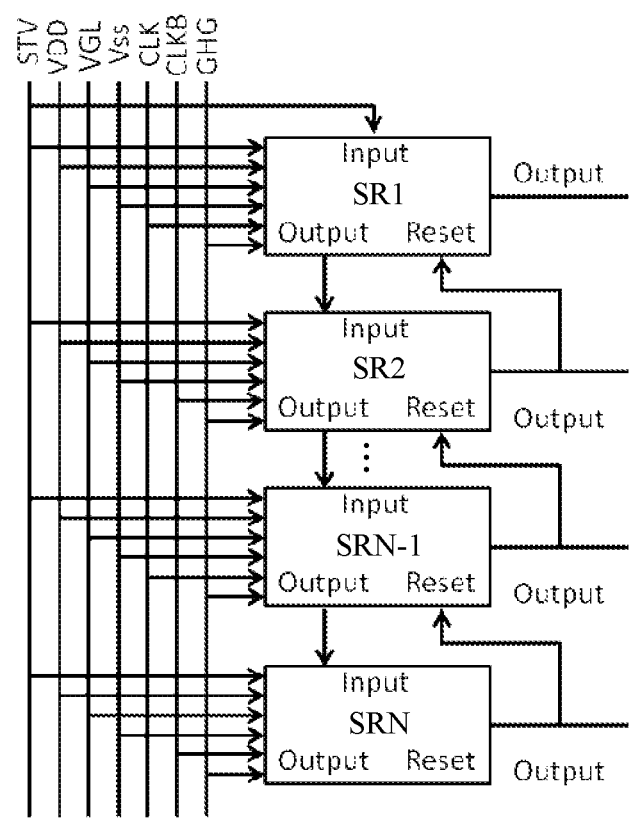
FIG. 8 schematically illustrates a diagram of the structure of a gate drive device according to an embodiment of the present disclosure.

FIG. 8 schematically illustrates a block diagram of the structure of a gate drive device according to the embodiment in the present disclosure. The gate drive device 700 includes a multi-level shift register unit, i.e., SR1, SR2, SR3, . . . , SRN–1, SRN. Each stage of the shift register unit can use the structure described above.

Wherein the signal input end of the shift register unit at the first stage is connected with the start signal end; as an active pulse signal, the start signal's option can be a frame start signal STV, the reset signal end of the shift register unit at the first stage is connected with the output end of the shift register unit at the next stage; the signal input end of the shift register unit at the last stage is connected with the output end of the shift register unit at the previous stage, and the reset signal end of the shift register unit at the last stage is connected with the frame start signal STV.

With respect to the shift register units SRn other than the shift register units at the first and the last stage, the signal input end of other shift register units SRn is connected with the output end of the shift register unit SRn–1 at the previous stage, the reset signal end is connected with the output end of the shift register unit SRn + 1 at the next stage; and all the cascaded shift register units are the shift register units shown in both FIGS. 2 and 5, wherein n is a natural number, greater than 1 but smaller than N.

As shown in FIG. 8, each shift register has clock signal end CLK, CLKB, power supply ends VDD, VGL, Vss, and control signal end GHG.

FIG. 9 schematically illustrates a flow diagram of a drive method 900 for the shift register unit according to an embodiment of the present disclosure. The shift register unit to which the drive method 900 is applied may include an input sub-circuit, a reset sub-circuit, an output sub-circuit, a pull-down controlling sub-circuit, a pull-down sub-circuit, wherein the input sub-circuit connects a signal input end, a high-level voltage signal end and a pull-up node, the reset sub-circuit connects the reset signal end, a first low-level voltage signal end and the pull-up node, the output sub-circuit connects the clock signal end, the control signal end, the pull-up node and the output end at the current stage, the pull-down controlling sub-circuit connects the high-level voltage signal end, a pull-up node, a second low-level voltage signal end and the pull-down node, and the pull-down sub-circuit connects the second low-level voltage signal end, the pull-down node, the pull-up node PU and the output end at the current stage. The structure of the shift register unit can see illustrations in FIGS. 2 and 5 and related descriptions.

As shown in FIG. 9, the drive method 900 may include:

In the first phase, after receiving a signal of the signal input end, the input sub-circuit pulls the potential of the pull-up node up to a high level of the high-level voltage signal end; after receiving the high-level voltage signal outputted by the pull-up node, the pull-down controlling sub-circuit pulls the potential of the pull-down node down to a low level (S901).

In the first mode of the second phase, when the control signal is a first level, the output sub-circuit provides a clock signal outputted by the clock signal end for the output end of the shift register unit after receiving the high-level voltage signal outputted by the pull-up node; the pull-down controlling sub-circuit still holds the low level of the pull-down node (S9021).

In the second mode of the second phase, when the control signal is a second level, the output sub-circuit has no output so that the reset sub-circuit has no input of reset signal, and at this time the touch signal can be scanned (S9022).

In the third phase, after receiving the reset signal of the reset signal end, the reset sub-circuit pulls the pull-up node down to the low level; after receiving the high-level voltage signal outputted by the high-level voltage signal end, the pull-down controlling sub-circuit pulls the pull-down node up to the high level; after receiving the high level outputted by the pull-down node, the pull-down sub-circuit pulls the output end and the pull-up node of the shift register down to the second low-level voltage (S903).

In the fourth phase, when the input sub-circuit has no input signal, the pull-down controlling sub-circuit makes the pull-down node keep the high potential; after receiving the high level outputted by the pull-down node, the pull-down sub-circuit pulls the output end and pull-up node of the shift register down to the second low-level voltage (S904).

Through a simple manner, the technical scheme for the drive method of the shift register unit according to the embodiment of the present disclosure, can realize GOA signal storage by line when the touch signal is transmitted and GOA signal continuously scanning by line when touch signal transmission is completed to prevent the touch signal and a panel signal from interfering with each other. The above design can achieve the switch between touch function GOA and traditional GOA, and realize the pull-down node PD constantly being at high potential, continuous noise reduction and yield improvement in the non-working state.

The above is illustrative of the invention and should not be considered limiting thereof. Although a number of exemplary embodiments of the present invention, those skilled in the art will readily appreciate without departing from the novel teaching and advantages of the present invention may be provided in the exemplary embodiments many modifications. Accordingly, all such modifications are intended to be included within the claims as defined by the scope of the invention. It should be understood that the above description of the present invention, and should not be considered limited to the particular embodiments disclosed, and modifications are intended to the disclosed embodiment as well as other embodiments included within the scope of the appended claims. The present invention is defined by the appended claims and equivalents thereof.

The present application claims priority to Chinese Patent Application No. 201510515960.6 filed on Aug. 20, 2015, the contents of which are hereby incorporated by reference in its entirety as part of the disclosure of the present application.

The invention claimed is:

1. A shift register unit, comprising:
an input sub-circuit, connecting a signal input end, a high-level voltage signal end, and a pull-up node, and configured to provide a high-level voltage signal for the pull-up node in response to an input signal of the signal input end;
a reset sub-circuit, connecting a reset signal end, a first low-level voltage signal end, and the pull-up node, and configured to provide a first low-level voltage signal for the pull-up node in response to a reset signal of the reset signal end;
an output sub-circuit, connecting a clock signal end, a control signal end, the pull-up node, a pull-down sub-circuit, and an output end at a current stage, and configured to provide a clock signal outputted by the clock signal end for an output end of the shift register unit at the current stage in response to a voltage signal of the pull-up node and a control signal of a first level; and to make the output end at the current stage have no output to scan a touch signal in response to a control signal of a second level;
a pull-down controlling sub-circuit, connecting the high-level voltage signal end, the pull-up node, a second low-level voltage signal end, and a pull-down node, and configured to provide a second low-level voltage signal for the pull-down node in response to the voltage signal of the pull-up node, and to provide the high-level voltage signal for the pull-down node in response to the high-level voltage signal; and
the pull-down sub-circuit, connecting the second low-level voltage signal end, the pull-down node, and the output end at the current stage, and configured to provide the second low-level voltage signal for the pull-up node and the output end at the current stage in response to the voltage signal of the pull-down node,
wherein the output sub-circuit comprises a third transistor, a capacitor, and a seventh transistor, wherein, in the output sub-circuit:
a gate of the third transistor is connected with the pull-up node, a first pole thereof is connected with a second pole of the seventh transistor, and a second pole thereof is connected with the output end at the current stage;
the capacitor is connected between the pull-up node and the output end at the current stage; and
a gate of the seventh transistor is connected with the control signal end, a first pole thereof is connected with the clock signal end, and a second pole thereof is connected with the first pole of the third transistor,
in the output sub-circuit, when the control signal is the first level, the seventh transistor is turned on and stays at a high level, and the third transistor transmits the clock signal to the output end at the current stage in response to the voltage signal of the pull-up node, when the control signal is the second level, the seventh transistor is turned off and does not provide output signals to the output end at the current stage.

2. The shift register unit according to claim 1, wherein the input sub-circuit comprises:
a first transistor, wherein a gate of the first transistor is connected with the signal input end, a first pole thereof is connected with the high-level voltage signal end, and a second pole thereof is connected with the pull-up node.

3. The shift register unit according to claim 1, wherein the reset sub-circuit comprises:
a second transistor, wherein a gate of the second transistor is connected with the reset signal end, a first pole thereof is connected with the first low-level voltage signal end, and a second pole thereof is connected with the pull-up node.

4. The shift register unit according to claim 1, wherein the pull-down controlling sub-circuit comprises:
a sixth transistor, wherein a gate of the sixth transistor is connected with the pull-up node, a first pole thereof is connected with the second low-level voltage signal end, and a second pole thereof is connected with the pull-down node;
an eighth transistor, wherein a gate of the eighth transistor is connected with the pull-up node, a first pole thereof is connected with the second low-level voltage signal end, and a second pole thereof is connected with a gate of a tenth transistor;
a ninth transistor, wherein a gate and the first pole of the ninth transistor are connected with the high-level voltage signal end, and a second pole thereof is connected with the gate of the tenth transistor; and
the tenth transistor, wherein a first pole of the tenth transistor is connected with the high-level voltage signal end, and a second pole thereof is connected with the pull-down node.

5. The shift register unit according to claim 1, wherein the pull-down sub-circuit comprises:
a fourth transistor, wherein a gate of the fourth transistor is connected with the pull-down node, a first pole thereof is connected with the second low-level voltage signal end, and a second pole thereof is connected with the output end at the current stage; and
a fifth transistor, wherein a gate of the fifth transistor is connected with the pull-down node, a first pole thereof is connected with the second low-level voltage signal end and a second pole thereof is connected with the pull-up node.

6. A gate drive device, comprising cascaded N shift register units according to claim 1, the N shift register units are those from a first shift register unit to an Nth shift register unit, wherein N is a natural number,
wherein a signal input end of each shift register unit from a second shift register unit to the Nth shift register unit is connected with an output end of a shift register unit at a previous stage,
a reset signal end of each shift register unit from the first shift register unit to an N–1th shift register unit is connected with an output end of the shift register unit at a next stage,
a signal input end of the first shift register unit is connected with a frame start signal end, and a reset signal end of the Nth shift register unit is connected with the frame start signal end.

7. A display device, comprising the gate drive device of claim 6.

8. A drive method for a shift register unit according to claim 1,
the drive method comprising:
in a first phase, after receiving a signal of the signal input end, the input sub-circuit pulls a potential of the pull-up node up to the high level of the high-level voltage signal end; after receiving a high-level voltage signal outputted by the pull-up node, the pull-down controlling sub-circuit pulls a potential of the pull-down node down to a low level;
in a first mode of a second phase, when the control signal is the first level, the output sub-circuit provides a clock signal outputted from the clock signal end for the output end of the shift register unit after receiving the high-level voltage signal outputted from the pull-up node; and the pull-down controlling sub-circuit still holds the low level of the pull-down node;
in a second mode of the second phase, when the control signal is the second level, the output sub-circuit has no output so that the reset sub-circuit has no input of a reset signal, thereby scanning a touch signal during this period;
in a third phase, after receiving the reset signal of the reset signal end, the reset sub-circuit pulls the pull-up node down to the low level; after receiving the high-level voltage signal outputted by the high-level voltage signal end, the pull-down controlling sub-circuit pulls the pull-down node up to the high level; after receiving the high level outputted by the pull-down node, the pull-down sub-circuit pulls the output end and the pull-up node of the shift register unit down to a second low-level voltage;
in a fourth phase, when the input sub-circuit has no input signal, the pull-down controlling sub-circuit makes the pull-down node keep a high potential; and after receiving the high level outputted by the pull-down node, the pull-down sub-circuit pulls the output end and pull-up node of the shift register unit down to the second low-level voltage.

9. A shift register unit, comprising:
an input sub-circuit, connecting a signal input end, a high-level voltage signal end, and a pull-up node, and configured to provide a high-level voltage signal for the pull-up node in response to an input signal of the signal input end;
a reset sub-circuit, connecting a reset signal end, a first low-level voltage signal end, and the pull-up node, and configured to provide a first low-level voltage signal for the pull-up node in response to a reset signal of the reset signal end;
an output sub-circuit, connecting a clock signal end, a control signal end, the pull-up node, a pull-down sub-circuit, and an output end at a current stage, and configured to provide a clock signal outputted by the clock signal end for an output end of the shift register unit at the current stage in response to a voltage signal of the pull-up node and a control signal of a first level; and to make the output end at the current stage have no output to scan a touch signal in response to a control signal of a second level;
a pull-down controlling sub-circuit, connecting the high-level voltage signal end, the pull-up node, a second low-level voltage signal end, and a pull-down node, and configured to provide a second low-level voltage signal for the pull-down node in response to the voltage signal of the pull-up node, and to provide the high-level voltage signal for the pull-down node in response to the high-level voltage signal; and the pull-down sub-circuit, connecting the second low-level voltage signal end, the pull-down node, and the output end at the current stage, and configured to provide the second low-level voltage signal for the pull-up node and the output end at the current stage in response to the voltage signal of the pull-down node, wherein the output sub-circuit comprises a third transistor, a capacitor, and a seventh transistor, wherein, in the output sub-circuit:

a gate of the third transistor is connected with the pull-up node, a first pole thereof is connected with the clock signal end, and a second pole thereof is connected with a first pole of the seventh transistor;

the capacitor is connected between the pull-up node and the output end at the current stage; and a gate of the seventh transistor is connected with the control signal end, a first pole thereof is connected with a second pole of the third transistor, and a second pole thereof is connected with the output end at the current stage, in the output sub-circuit, when the control signal is the first level, the seventh transistor is turned on and stays at a high level, and the third transistor transmits the clock signal to the output end at the current stage in response to the voltage signal of the pull-up node, when the control signal is the second level, the seventh transistor is turned off and does not provide output signals to the output end at the current stage.

10. A gate drive device, comprising cascaded N shift register units according to claim 9, the N shift register units are those from a first shift register unit to an Nth shift register unit, wherein N is a natural number, wherein a signal input end of each shift register unit from a second shift register unit to the Nth shift register unit is connected with an output end of a shift register unit at a previous stage, a reset signal end of each shift register unit from the first shift register unit to an N−1 th shift register unit is connected with an output end of the shift register unit at a next stage, a signal input end of the first shift register unit is connected with a frame start signal end, and a reset signal end of the Nth shift register unit is connected with the frame start signal end.

11. A display device, comprising the gate drive device of claim 10.

12. A drive method for a shift register unit according to claim 9, the drive method comprising:

in a first phase, after receiving a signal of the signal input end, the input sub-circuit pulls a potential of the pull-up node up to the high level of the high-level voltage signal end; after receiving a high-level voltage signal outputted by the pull-up node, the pull-down controlling sub-circuit pulls a potential of the pull-down node down to a low level;

in a first mode of a second phase, when the control signal is the first level, the output sub-circuit provides a clock signal outputted from the clock signal end for the output end of the shift register unit after receiving the high-level voltage signal outputted from the pull-up node; and the pull-down controlling sub-circuit still holds the low level of the pull-down node;

in a second mode of the second phase, when the control signal is the second level, the output sub-circuit has no output so that the reset sub-circuit has no input of a reset signal, thereby scanning a touch signal during this period;

in a third phase, after receiving the reset signal of the reset signal end, the reset sub-circuit pulls the pull-up node down to the low level; after receiving the high-level voltage signal outputted by the high-level voltage signal end, the pull-down controlling sub-circuit pulls the pull-down node up to the high level; after receiving the high level outputted by the pull-down node, the pull-down sub-circuit pulls the output end and the pull-up node of the shift register unit down to a second low-level voltage;

in a fourth phase, when the input sub-circuit has no input signal, the pull-down controlling sub-circuit makes the pull-down node keep a high potential; and after receiving the high level outputted by the pull-down node, the pull-down sub-circuit pulls the output end and pull-up node of the shift register unit down to the second low-level voltage.

* * * * *